United States Patent
Chowdhury et al.

(10) Patent No.: US 10,591,526 B1
(45) Date of Patent: Mar. 17, 2020

(54) SYSTEMS AND METHODS TO GENERATE A TEST BENCH FOR ELECTROSTATIC DISCHARGE ANALYSIS OF AN INTEGRATED CIRCUIT DESIGN

(71) Applicant: CADENCE DESIGN SYSTEMS, INC., San Jose, CA (US)

(72) Inventors: Nandu Kumar Chowdhury, Greater Noida (IN); Parveen Khurana, Delhi (IN); Yue-Zhong Shu, Shanghai (CN); Yoshimi Kitagawa, Saitama (JP)

(73) Assignee: Cadence Design Systems, Inc., San Jose, CA (US)

( * ) Notice: Subject to any disclaimer, the term of this patent is extended or adjusted under 35 U.S.C. 154(b) by 122 days.

(21) Appl. No.: 15/948,972

(22) Filed: Apr. 9, 2018

(51) Int. Cl.
*G01R 31/00* (2006.01)
*G01R 31/3183* (2006.01)
*G06F 15/02* (2006.01)
*G01R 31/28* (2006.01)
*G06F 30/327* (2020.01)
*G06F 30/398* (2020.01)

(52) U.S. Cl.
CPC ....... *G01R 31/002* (2013.01); *G01R 31/2834* (2013.01); *G01R 31/318307* (2013.01); *G06F 15/0225* (2013.01); *G06F 30/327* (2020.01); *G06F 30/398* (2020.01)

(58) Field of Classification Search
USPC ........................................ 716/136
See application file for complete search history.

(56) References Cited

U.S. PATENT DOCUMENTS

| | | | | |
|---|---|---|---|---|
| 2007/0001688 A1* | 1/2007 | Schnelder | ............ | G01R 31/312 324/605 |
| 2009/0210210 A1* | 8/2009 | Imtiaz | ................. | G06F 17/5036 703/14 |
| 2013/0223024 A1* | 8/2013 | Huebl | .................. | H05K 9/0067 361/752 |
| 2014/0028348 A1* | 1/2014 | Andreev | ............ | H03K 19/0948 326/41 |
| 2014/0103959 A1* | 4/2014 | Andreev | ........ | H03K 19/018585 326/41 |
| 2016/0098561 A1* | 4/2016 | Keller | ................... | G06F 21/554 726/24 |

* cited by examiner

*Primary Examiner* — Mohammed Alam
(74) *Attorney, Agent, or Firm* — Eric L. Sophir; Dentons US LLP (57) ABSTRACT

Disclosed herein are embodiments of systems, methods, and products to automatically and intelligently generate a test bench to test an electrostatic discharge (ESD) protection circuit in an integrated circuit (IC) design. A computer may receive netlist of the IC design forming a device under test (DUT). From the DUT, the computer may extract and/or calculate one or more parameters. Based on the one or more parameters, the computer may generate a test bench comprising a resistance inductance capacitance (RLC) circuit to provide ESD stimulus to the DUT. The ESD stimulus and therefore the test bench may be based on a human body model (HBD) or a charged device model (CDM). In case of the CDM, the computer may allow a circuit designer to select or deselect package parameters for testing the ESD protection circuit.

20 Claims, 6 Drawing Sheets

SYSTEMS AND METHODS TO GENERATE A TEST BENCH FOR ELECTROSTATIC DISCHARGE ANALYSIS OF AN INTEGRATED CIRCUIT DESIGN

TECHNICAL FIELD

This application relates generally to power verification and signoff of integrated circuit (IC) design and specifically to automatically generating a test bench circuit for testing electrostatic discharge (ESD) protection circuit of an IC design.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for schematics, layouts, simulation, and verification of the complex circuits. A significant step of designing and validating a complex IC is power verification and signoff. For example, an EDA tool should verify that components within the IC receive and consume power within respective constraints, that the overall power flow within the IC is optimized, and that IC is able to handle catastrophic power conditions wherein the IC experiences a transient or prolonged power overload.

An example of catastrophic power condition is electrostatic discharge (abbreviated as ESD), which is a very common cause of IC failures. An ESD is a sudden flow of electric current, often a high current, between two electrically charged objects. For example, ESD events produce high currents into the input pins of an IC chip. Such high current in the IC chip may cause functional failure and in many cases may cause an oxide damage resulting in a complete circuit breakdown. To mitigate circuit damage from an ESD event, circuit designers insert protection circuits within the IC. A protection circuit design may comprise ESD cells. An ESD cell may clamp high voltage and drain a high current through a safe discharge path such as a ground pin. The ESD cells within an IC design have to be tested during power verification and signoff stage of the IC design.

Conventional systems and methods of testing ESD cells have several technical shortcomings. For example, in a conventional system, circuit designers have to manually setup a test bench specific to an IC design being tested. If another IC design has to be tested, the circuit designers have to setup another test bench. This approach is cumbersome, time-consuming, and prone to errors. Furthermore, ESD events generated by manual test benches may not be accurate and may generate invalid test results.

SUMMARY

What is therefore desired is technology that automatically generates a test bench for testing ESD protection circuit in an IC design. Embodiments disclosed herein attempt to solve the aforementioned problems and may provide solutions to other problems as well. More specifically, the embodiments disclosed herein describe a computer that may receive a netlist forming a device under test (DUT), extract or calculate one or more parameters from the netlist, automatically and intelligently generate a test bench based upon the one or more parameters, and provide an electrostatic discharge (ESD) stimulus to the DUT through the test bench. The test bench circuit may be pin specific: the computer may extract or calculate one or more parameters for a first pin and generate a first test bench to provide a first ESD stimulus to the first pin; and the computer may extract or calculate one or more parameters for a second pin and generate a second test bench to provide a second ESD stimulus to the second pin. The computer may generate the test benches to simulate a human body model (HBM) or a charged device model (CDM) and allow a circuit designer to modify the test bench or one or more attributes of each of the HBM and CDM. In case of a CDM, the computer may allow the circuit designer to incorporate package parameters during the testing of the DUT.

In an embodiment, computer implemented method comprises receiving, by a computer, a netlist file comprising data records of a plurality of circuit devices and a plurality of nets interconnecting the plurality of circuit devices, wherein the netlist file forms a device under test (DUT); calculating, by the computer, a first parameter associated with a first injection pin of the DUT based upon data records of at least a portion of the plurality of circuit devices and the plurality of nets; generating, by the computer, a test bench comprising a resistance inductance capacitance (RLC) circuit for the first injection pin based on the first parameter; transmitting, by the computer, an electrostatic discharge (ESD) stimulus from the RLC circuit to the first injection pin of the DUT; and in response to determining by the computer that the ESD stimulus discharged through a ground pin of the DUT: generating, by the computer, an indication that the DUT has passed an ESD analysis test on the first injection pin.

In another embodiment, a system for circuit design, comprises one or more computers comprising a non-transitory machine-readable media configured to store a netlist file comprising data records of a plurality of circuit devices and a plurality of nets interconnecting the plurality of circuit devices, wherein the netlist file forms a device under test (DUT); at least one computer of the one or more computers, the at least one computer coupled to the non-transitory machine readable media storing the netlist file and comprising a processor configured to: calculate a first parameter associated with a first injection pin of the DUT based upon data records of at least a portion of the plurality of circuit devices and the plurality of nets; generate a test bench comprising a resistance inductance capacitance (RLC) circuit for the first injection pin based on the first parameter; transmit an electrostatic discharge (ESD) stimulus from the RLC circuit to the first injection pin of the DUT; and in response to determining by the processor that the ESD stimulus discharged through a ground pin of the DUT: generate an indication that the DUT has passed an ESD analysis test on the first injection pin.

In yet another embodiment, a computer readable non-transitory medium containing one or more computer instructions, which when executed by a processor cause the processor to: receive a netlist file comprising data records of a plurality of circuit devices and a plurality of nets interconnecting the plurality of circuit devices, wherein the netlist file forms a device under test (DUT); calculate a first parameter associated with a first injection pin of the DUT based upon data records of at least a portion of the plurality of circuit devices and the plurality of nets; generate a test bench comprising a resistance inductance capacitance (RLC) circuit for the first injection pin based on the first parameter; transmit an electrostatic discharge (ESD) stimulus from the RLC circuit to the first injection pin of the DUT; and in response to determining by the processor that the ESD stimulus discharged through a ground pin of the DUT: generate an indication that the DUT has passed an ESD analysis test on the first injection pin.

BRIEF DESCRIPTION OF THE DRAWINGS

The accompanying drawings constitute a part of this specification and illustrate embodiments of the subject matter disclosed herein.

DETAILED DESCRIPTION

Reference will now be made to the illustrative embodiments illustrated in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one ordinarily skilled in the relevant art and having possession of this disclosure, are to be considered within the scope of the subject matter disclosed herein. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Embodiments disclosed herein describe systems and methods that automatically and intelligently generate and setup test benches that provide accurate electrostatic discharge (ESD) events to test an ESD protection circuit within an integrated circuit (IC) design. An exemplary system may comprise a computer that receives a netlist file of an IC design defining a device under test (DUT). The computer may extract and/or compute one or more parameters of the DUT and generate a test bench from the one or more parameters. The test bench may comprise a resistance inductance capacitance (RLC) circuit that provides an ESD stimulus based on one or more of a human body model (HBM) and charged device model (CDM). An HBM may capture an ESD event into a pin of an IC occurring from a human body such as a finger touching a pin of the IC. A CDM may capture an ESD event when a chip containing the IC is mounted during assembly and manufacturing. For example, a package may inductively charge up during its transport along a conveyor belt. The discharge may then take place when a pin of chip (or the IC therein) gets in contact with any metal. Because of the inductive charging, a CDM test bench may include the effect of the substrate network, and the embodiments disclosed herein automatically account for the substrate network for generating a CDM stimulus. Furthermore, the computer may connect the DUT to a package circuitry such that package parameters are accounted for while using a CDM test bench. The computer may provide a switch to a circuit designer providing an ability to switch the package effect on or off.

In addition to the automatic and intelligent generation of the test bench, the computer may have the flexibility for the designer to specify or modify a test bench and/or the transient stimulus signal (also referred to as test signal) generated by the test bench. More specifically, the computer may present a graphical user interface for a circuit designer to modify one or more components of the test bench. Or, the computer may allow the user to specify various attributes of the transient stimulus signal such as peak current and transient period and then generate a test bench based upon these specifications.

Once generated, a test bench may provide a transient stimulus signal to test ESD protection circuit in the DUT. For example, a test bench generated for a first input pin may provide a first transient stimulus signal (based on HBM or CDM) to the first pin. If the ESD protection circuit causes the current from the stimulus signal through the ground pin without reaching other functional areas of the DUT, the computer may generate an indication that the DUT has passed an ESD analysis test as to the first pin. If, however the current generated by the ESD stimulus or a portion thereof reaches other functional areas of the IC and does not fully or partially discharge from the ground pin, the computer may generate an indication that the DUT has not passed an ESD analysis as to the first pin. The computer may then display the indication via a graphical user interface (GUI).

Figure 1:
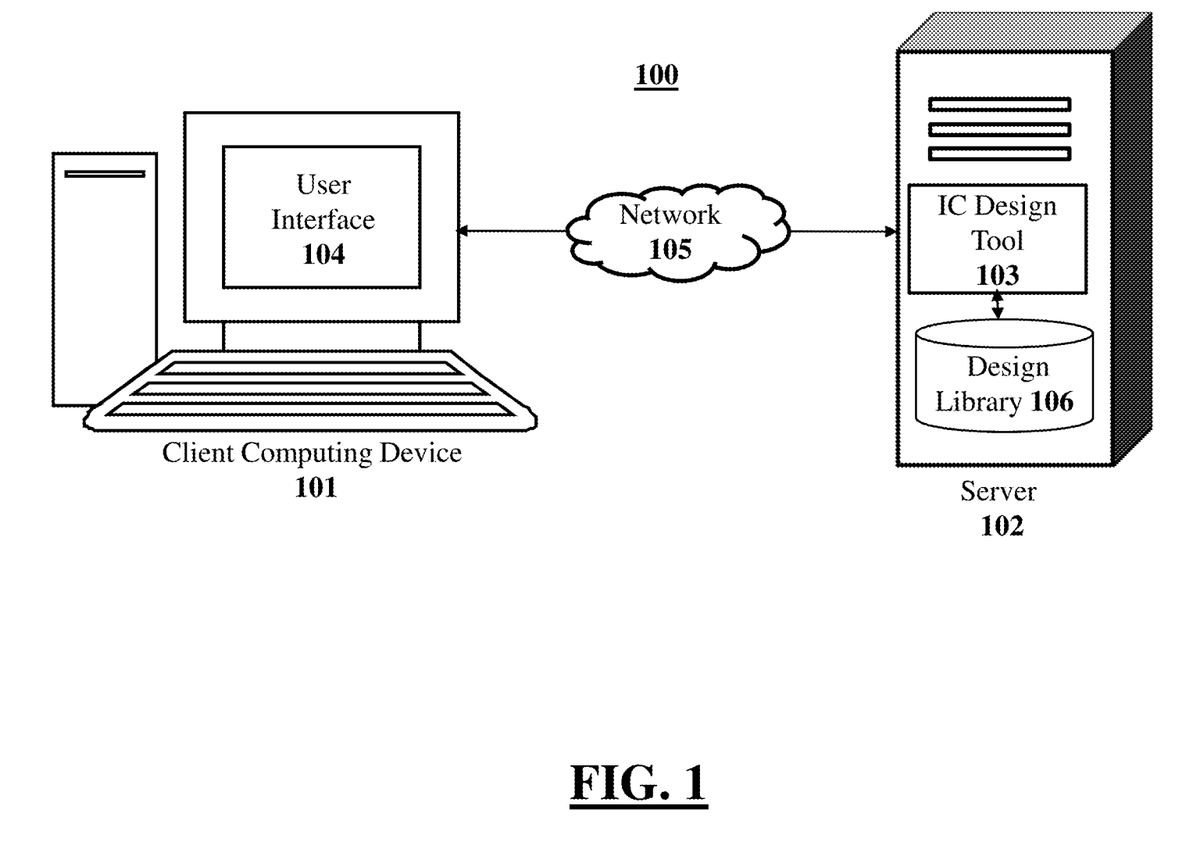
FIG. 1 shows an exemplary system of generating a test bench, according to an exemplary embodiment.

FIG. 1 illustrates an electronic design automation (EDA) system 100, according to an exemplary embodiment. The EDA system 100 may include any number of computing devices; the exemplary embodiment may include a client computing device 101 and a server 102. One or more components of the electronic design automation system 100 may be grouped and referred to as an electronic design automation tool (or EDA tool). The client 101 may be connected to the server 102 via hardware and software components of one or more networks 105. A network 105 may also connect various computing devices with databases or other components of the system 100. Examples of the network 105 include, but are not limited to, Local Area Network (LAN), Wireless Local Area Network (WLAN), Metropolitan Area Network (MAN), Wide Area Network (WAN), and the Internet. The communication over the network 105 may be performed in accordance with various communication protocols, such as Transmission Control Protocol and Internet Protocol (TCP/IP), User Datagram Protocol (UDP), and IEEE communication protocols.

A client computing device 101 may be any computing device comprising a processor/microcontroller and/or any other electronic component that performs one or more operations according to one or more programming instructions. The examples of the computing device may include, but are not limited to, a desktop computer, a laptop, a personal digital assistant (PDA), a smartphone, a tablet computer, and the like. The client computing device 101 may be configured to communicate with one or more servers 102 of the system 100 through one or more networks 105, using wired and/or wireless communication capabilities. A user interface 104 in the client computing device 101 may include a Graphical User Interface (GUI) that presents an interactive, graphical representation of an IC design, layout, schematic, or other logical representation of an IC that is being designed, optimized, and verified using an IC design tool 103. The GUI 104 may provide interactive elements, such as graphical representations of IC design elements for a user to manipulate, optimize, and/or verify the IC design layout. In some embodiments, the user interface 104 may include a text based interface allowing the user to enter manual commands for designing, optimizing, and verifying the IC design layout. The user interface 104 may present the results of various verification commands such as power verification commands.

A server 102 may be accessible to the client device 101 via one or more networks 105. The server 102 may be any computing device comprising a processor and other computing hardware configured to execute an IC design tool 103 software module (e.g., EDA design or verification software) that may analyze, optimize, and verify an IC design. In operation, using a client device 101 to access a design tool 103 hosted on a server 102 over a network 105, a circuit designer may interact with the IC design tool 103, through a number of input devices of the client device 101, such as by inputting a selection as with a mouse or inputting a request as with a keyboard. The IC design tool 103 may generate any number of graphical interface 104 responses based on the inputs received from the client device 101, and then send the data back to the client device 101 to be presented on the GUI 104.

The server 102 may execute one or more component software modules of the IC design tool 103 software program, which may be a software program that allows users (e.g., engineers, circuit designers) to design, optimize, and verify circuit designs through software modules. The IC design tool 103 may provide users with interactive design interfaces 104 for designing an IC and the various design elements, execute automated optimization processes, execute automated layout-generation processes, and execute verification processes. The server 102 may comprise, or may be in networked-communication with, non-transitory machine-readable media configured to store a netlist of or any other file including records of IC design elements, which may be a machine-readable computer file or a design database containing one or more records of design elements (e.g., circuit devices, pcells, fixed cells) of the IC design. In operation, the IC design tool 103 may analyze and optimize the design elements of the netlist or any other type of file associated with the IC design. Non-limiting examples of circuit devices may include memory devices (e.g., D flip-flops, T flip-flops, SR flip flops, JK flip flops), combination logic gates (e.g., AND, OR, NOT, NOR, NAND, XOR), and multiplexers, among others. The netlist or any other type of file may also include records of a plurality of nets. The nets may be the records associated with the wires interconnecting the plurality of circuit devices. The IC design tool 103 may further verify the functionality of the IC design, for example, whether the IC design performs within one or more constraints. For instance, the IC design 103 may perform a power analysis to verify that an IC design or a portion thereof performs within a pre-selected power constraint.

The server 102 may include a design library 106 that is accessed by the IC design tool 103. The design library 106 may include instances of various circuit devices, for example, transistors used to layout an IC. In some embodiments, the design library 106 may include instances of pcells used by the IC design tool 103 to generate an IC layout. An instance of a pcell may represent electronic circuit components such as a transistor, transmission line, or an optical fiber line. The IC design tool 103 may use instances of pcells in the design library 106 to generate a netlist of an IC that can be sent to a manufacturing facility for fabrication.

The exemplary system 100 is shown in FIG. 1 as comprising only one server 102 for ease of explanation. However, it should be appreciated that the system 100 may comprise a number of servers 102. In some embodiments, the system 100 may comprise multiple interconnected, networked servers 102, some of which may execute various software modules configured to manage and control the resources and performance of the system 100. In some embodiments, the servers 102 may have parallel architectures configured to support multi-threading on multi-core workstations to handle large designs. In such embodiments, the servers 102 may be configured for distributed processing. The server 102 may be logically and physically organized within the same or different devices or structures, and may be distributed across any number of physical structures and locations (e.g., cabinets, rooms, buildings, cities)

In operation, the system 100 may receive a netlist of in integrated circuit (IC) defining a device under test (DUT). The system 100 may extract one or more parameters from the netlist. For a human body model (HBM), the one or more parameters may include an ON resistance or inductance of the pins of the DUT. For a charged device model (CDM), the one or more parameters may include parameters defining the nature of the substrate network because a high current may get into the circuit through the substrate. The system 100 may also connect a package model with the DUT for a CDM stimulus analysis. Once the test bench is generated, the system 100 may provide an electrostatic discharge (ESD) stimulus to a pin of the DUT. If the system 100 determines that the ESD stimulus is discharged through a ground pin of the DUT, the system 100 may generate a notification that the DUT has passed an ESD analysis test with respect to the pin.

Figure 2:
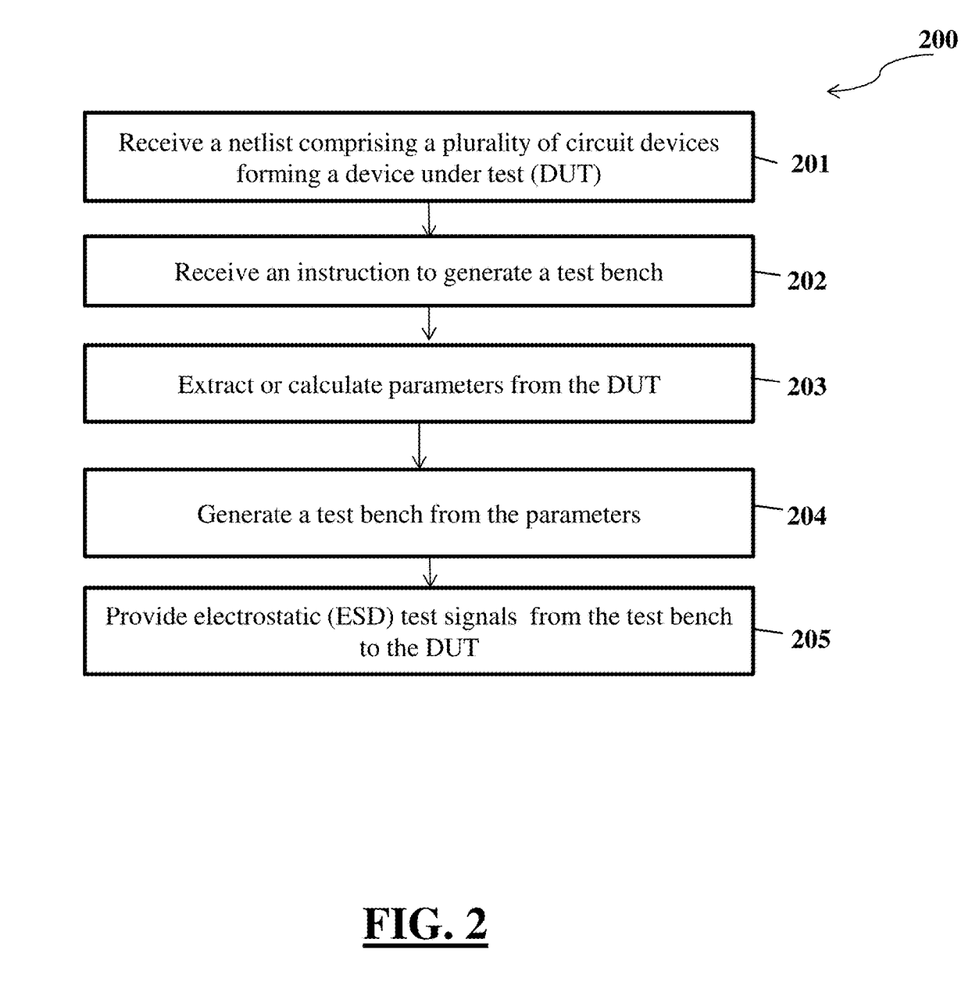
FIG. 2 shows an exemplary method of generating a test bench, according to an exemplary embodiment.

FIG. 2 shows an exemplary method of automatically and intelligently generating a test bench for a device under test (DUT), according to an exemplary embodiment. Although multiple computers and multiple databases may implement the various steps of the exemplary method 200, the following describes, for brevity, a computer and a database implementing the method 200. Furthermore, one having ordinary skill in the art understands that the method 200 may implement other alternative or additional steps than the one described below, and may skip one or more of the steps described below.

In a first step 201, the computer may receive a netlist (e.g., a netlist file, a design database) comprising a plurality of circuit devices. The netlist may also comprise a plurality of nets interconnecting the circuit devices. The computer may receive the netlist from another design tool or from an associated computer. Alternatively, the computer may retrieve the netlist from the database. The plurality of circuit devices and the plurality of nets within the netlist may form an integrated circuit (IC) design, designated as a device under test (DUT) in this description. In other words, the netlist may form a text based specification of the circuit devices and wires forming the DUT. The netlist may have been generated by another computer or a design tool based on SPICE language that a circuit designer may have used to design the DUT. In some embodiments, the computer may provide the compile functionality to generate the netlist from the DUT design described in a hardware description language.

In a next step 202, the computer may receive an instruction to generate a test bench from for the DUT formed by the netlist. The instructions may include a selection of an input/injection pin and a ground pin pair for which the test bench has to be generated. The computer may receive the instruction from a text based interface or a graphical user interface (GUI). Through the GUI, the computer may provide options for a circuit designer to select a DUT for which a test bench is to be generated. Furthermore, the computer may provide one or more options in the GUI to select between human body model (HBM) and charged device model (CDM) or provide any other instructions to customize the test bench to be generated. The aforementioned methods of receiving the instructions and selections are merely exemplary and other methods such as receiving a remote request from a remote computer should be considered to be within the scope of this disclosure.

In step 203, the computer may extract or calculate parameters from the DUT formed by the netlist. For example, the computer may calculate the ON resistance of the DUT. More specifically, based on the specifications of circuit devices and nets within the netlist forming the DUT, the computer may calculate the resistance of the DUT when the DUT is turned on and supplied with power. During a charged device mode (CDM) modelling, charge may get into a chip through the substrate; and as a result testing ESD reliability using the substrate is significant, and the computer may extract one or more parameters for the substrate network. A parameter may also include the impedance of the input pins or injection pins of the DUT. For example, there may be first impedance from a first input pin of the DUT to the ground pin of the DUT and there may be second impedance from a second input pin of DUT to the ground pin of the DUT. In case of the charged device model (CDM) ESD, the computer may extract one or more package parameters from a package design.

In some embodiments, the computer may allow a circuit designer to enter and/or modify one or more parameters for the test bench. For instance, the computer may allow a circuit designer, through a user interface, to change one or more of the resistance, inductance, and capacitance values of the test bench automatically and intelligently generated by the computer. Additionally, the computer may allow, through the user interface for a circuit designer to input one or more of resistance, inductance, and capacitance values, and then generate a test bench based upon the entered values. As mentioned above, the computer may further allow the circuit designer to select a model of a test bench design. For example, the computer may allow the circuit designer to select between an HBM and a CDM test bench. For CDM test bench, the computer may allow the circuit designer to specify package parameters.

In step 204, the computer may generate a test bench from the parameters. More specifically, the computer may generate a circuitry comprising one or more resistors (R), one or more inductors (L), and one or more capacitors (C) to provide an ESD stimulus to one or more pins of the DUT. The test bench may contain a configuration of the RLC components such that the ESD stimulation signal generated by the test bench is based upon the ON resistance or impedance of the DUT. For example, the computer may generate a test bench which provides a higher peak current stimulus to a pin with a higher resistance or impedance compared to a pin with a lower resistance or impedance. More generally, the computer may generate a test bench which generates transient stimulus signal based on the electrical characteristics of the receiving pin. In case of a CDM model, the computer may generate the test bench based upon on or more characteristics of the substrate network of the DUT. In some embodiments, the computer may generate a test bench for each of the pins in the DUT, based on the ON resistance or impedance of the pin. More specifically, the computer may conduct test bench modeling and circuit simulations in separate directories for each pin.

In addition, the computer may allow a circuit designer to modify one or more attributes of a stimulus and generate a test bench based on the modified stimulus. For example, the computer may allow a circuit designer, through a user interface (a graphical user interface or a text based interface) to modify the peak current value and/or the duration of the transient stimulus waveform.

In step 205, the computer may test the DUT by providing ESD test signals from test bench to the DUT. During the testing, the computer may determine whether the ESD is discharged through the ground pin, bypassing the critical logic of the circuit. More specifically, if the computer determines that the ESD is discharged through the ground pin without affecting other logic of the circuit, the computer may generate an indication that the DUT has passed the test. If the ESD permeates to the logic of the circuit and does not discharge through the ground pin, the computer may generate an indication that the DUT has failed the test. Furthermore, the computer may receive another instruction to generate a second test bench for the DUT, wherein the instruction may contain a selection of a second input/injection pin and a second ground pin. In other words, test benches may be injection pin ground pin pair specific, with specific test bench for each injection pin ground pin pair. The computer may repeat the steps of the method 200 for each input pin ground pin pair in the DUT, based on the user instructions.

In case of the CDM test signal (or stimulus), the computer may allow a circuit designer to select or deselect package parameters. In other words, the computer may provide a graphical user interface for the circuit designer to switch on a package circuitry on or off for testing the DUT.

Figure 3:
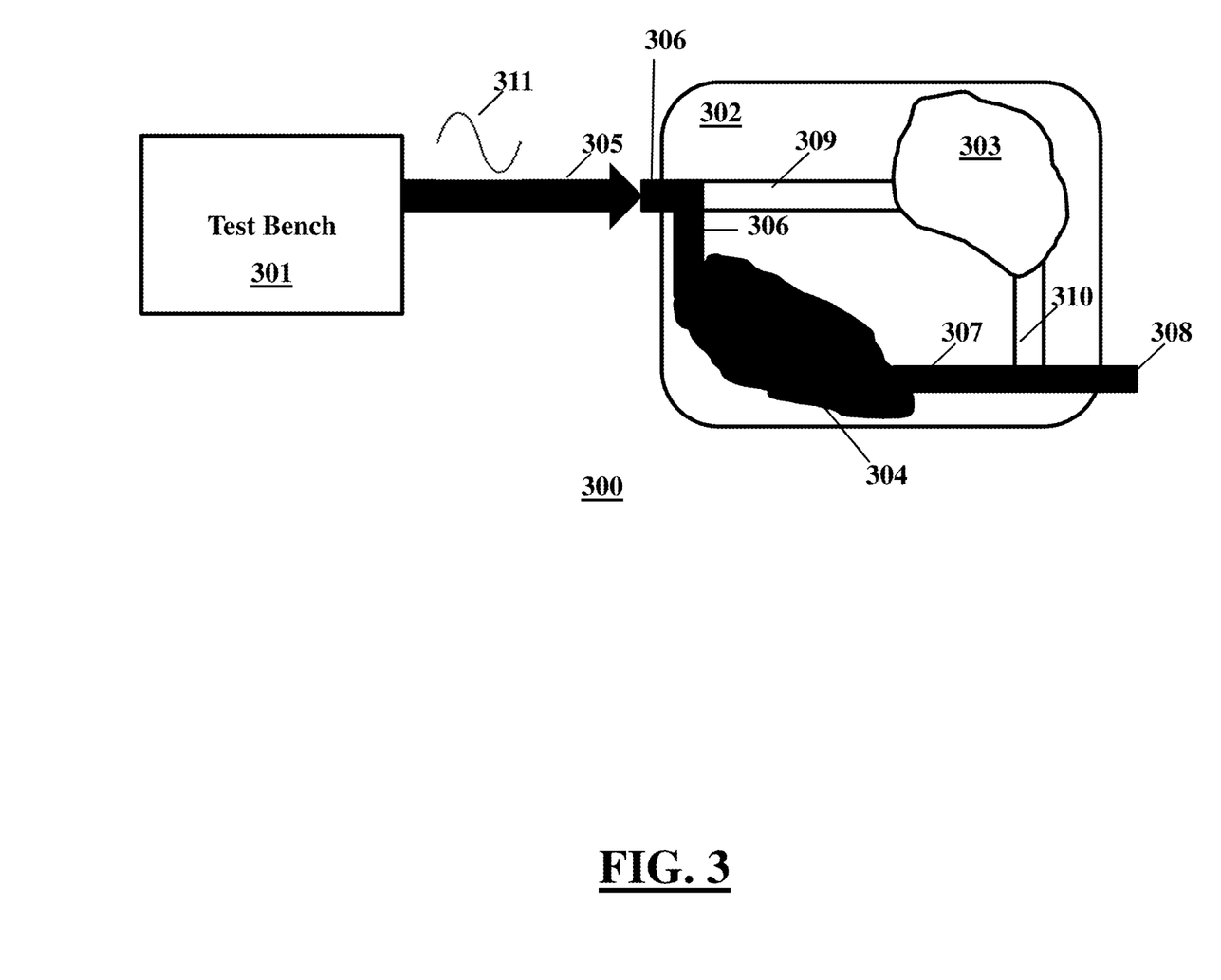
FIG. 3 shows an exemplary test bench providing an electrostatic discharge (ESD) stimulation to an exemplary device under test (DUT), according to an exemplary embodiment.

FIG. 3 shows an exemplary system 300 for testing electrostatic discharge (ESD) protection circuit. The system may comprise a test bench 301 and a device under test (DUT) 302, wherein the DUT 302 may comprise regular functional circuit 303 and ESD protection circuit 304. The ESD protection circuit 304 may comprise one or more ESD protection cells. The test bench 301 may comprise an RLC circuit and may have been generated by the aforementioned exemplary method 200.

In operation, the test bench 301 may generate a transient stimulus signal (also referred to as a test signal or simply as a stimulus signal) 311 to be fed into the DUT 302. More particularly, the test bench 301 may generate and provide the transient stimulus signal 311 through a connection 305 to an input pin 306 (which may be referred to as an injection pin) of the DUT 302. The input pin or injection pin 306 may be a power pin or a signal pin. The transient stimulus signal 311 may emulate a real-life ESD discharge event such as a human touch. After the input pin 306 receives the transient stimulus signal 311, the ESD protection circuit 304 may route the transient stimulus circuit through paths 306,307 to an ESD ground pin 308 while avoiding the regular functional circuit 303 and paths 309, 310. In other words, during this test, a properly functioning ESD protection circuit 304 should be able to safely discharge the transient stimulus signal 311 through the ground pin 308 and avoid the functional circuitry in the DUT 302. Embodiments disclosed herein may generate separate test benches for each pin within the DUT 306.

Figure 4:
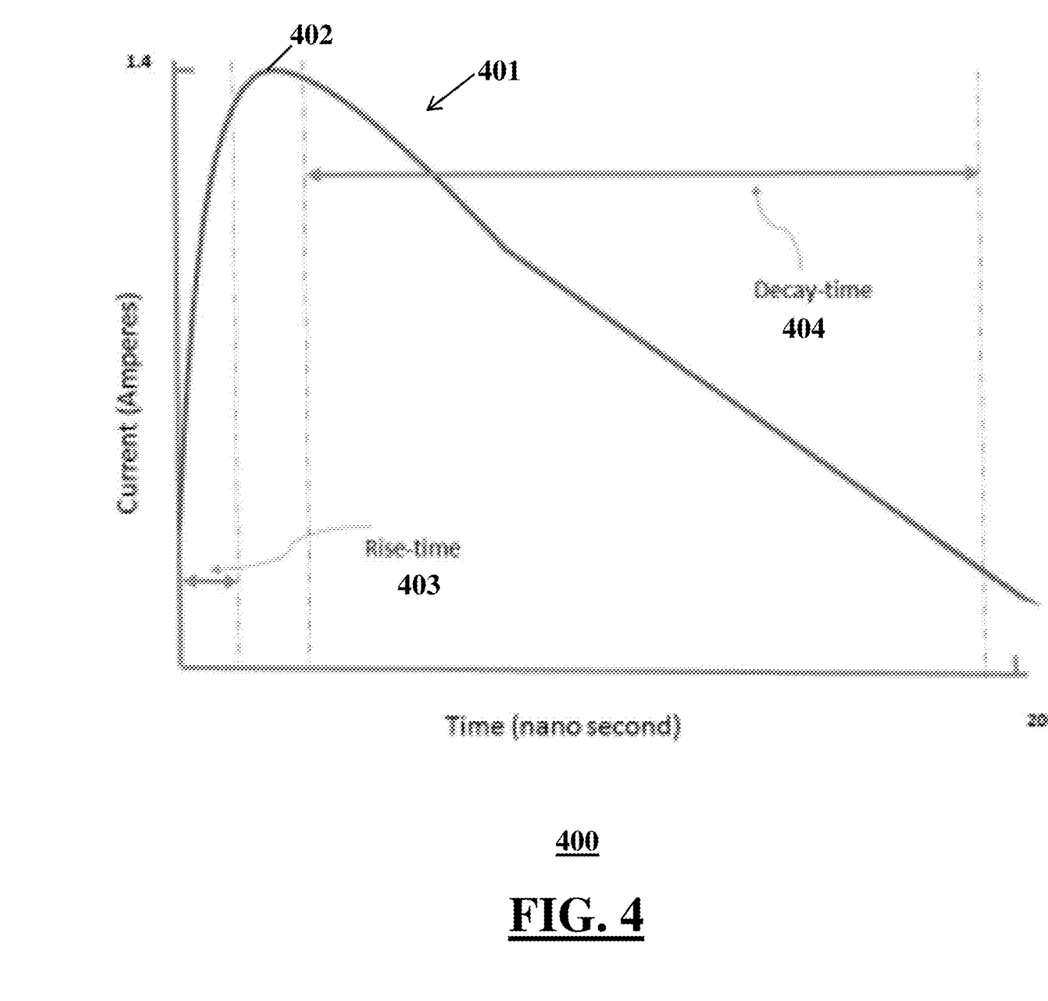
FIG. 4 shows a current time graph of an exemplary human body model (HBM) stimulus generated by a test bench, according to an exemplary embodiment.

FIG. 4 shows an exemplary graph 400 showing an electrostatic discharge (ESD) event caused by a human body touching a pin or any other portion of an integrated circuit (IC). More specifically, the exemplary graph 400 shows a waveform 401 emulating a human touch to a portion of the IC. The exemplary graph 400 may be based upon a human body model (HBM) electrostatic stimulus. As shown herein, the peak current 402 of the ESD event may be a few amperes (approximately 1.4 A), rise time 403 less than 10 nanoseconds, and decay time 404 approximately 150 nanoseconds.

Figure 5:
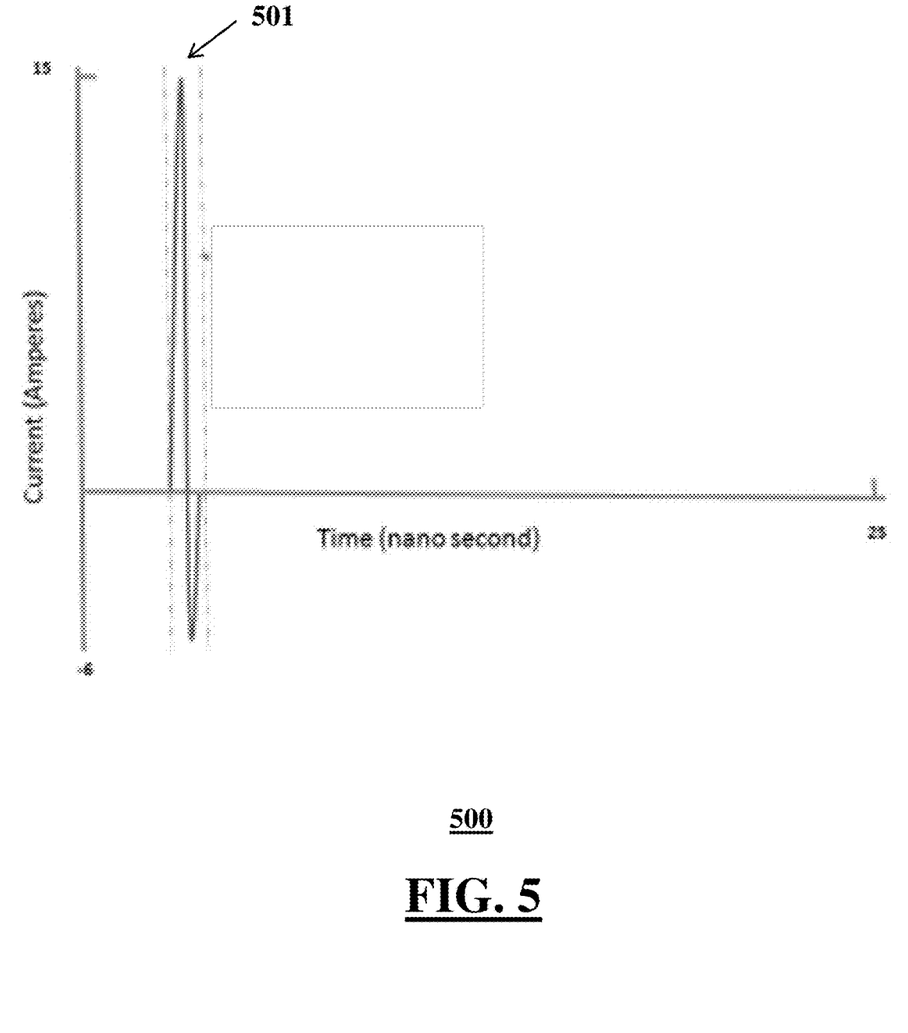
FIG. 5 shows a current time graph of an exemplary charged device model (CDM) stimulus generated by a test bench, according to an exemplary embodiment.

FIG. 5 shows an exemplary graph 500 showing an electrostatic discharge (ESD) caused by a charged device. For example, a package may be inductively charged up when the package is transported along a conveyor belt and there might be a discharge when a pin gets into contact with any metal. The exemplary graph 500 shows a waveform 501 emulating an input stimulus from a charged device coming in contact with a pin of an integrated circuit (IC). The exemplary graph 500 may be based upon a charged device model (CDM) electrostatic stimulus. As seen in the waveform 501, the input stimulus may a sub-nanosecond rise and decay time and a high range current peak.

Figure 6:
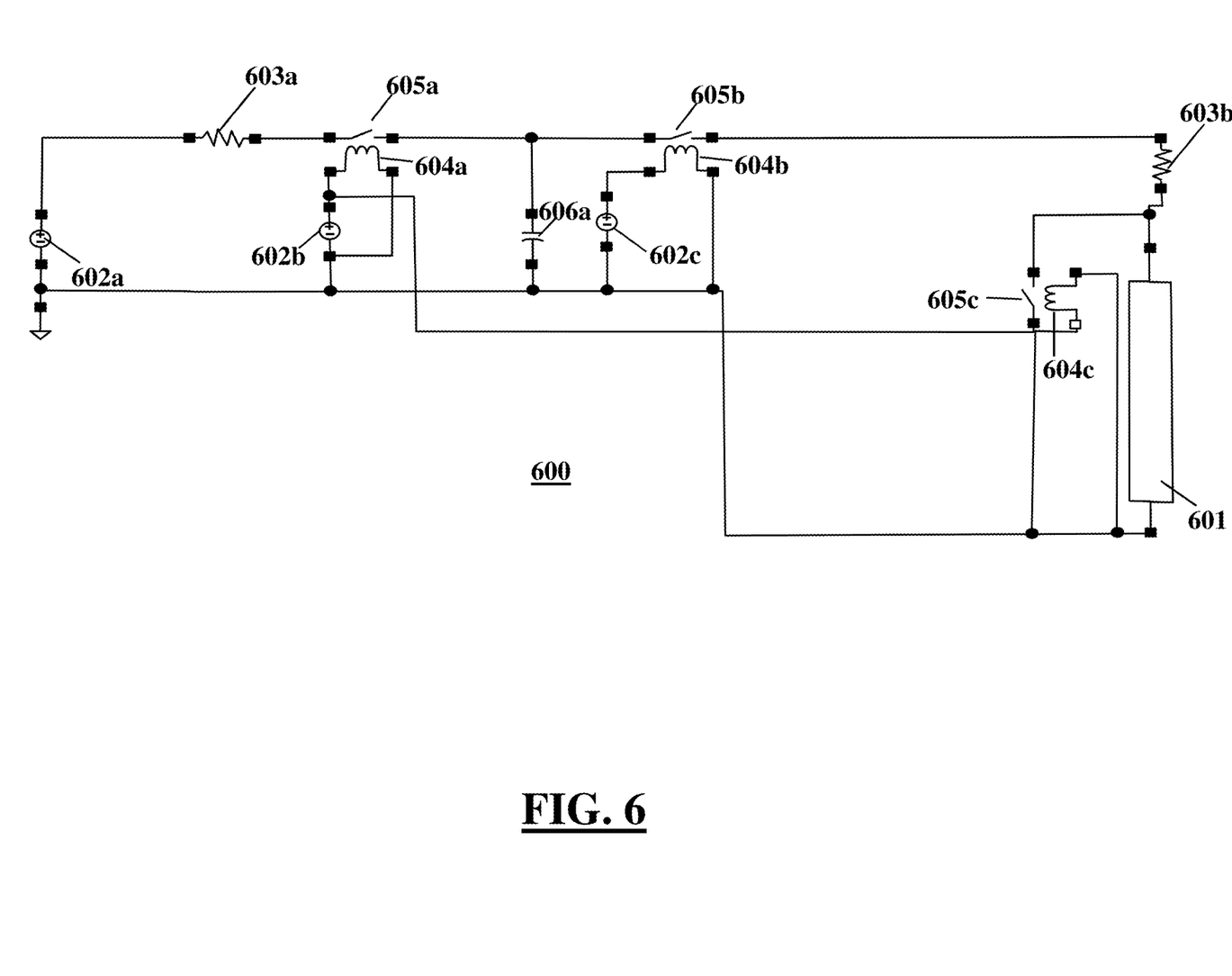
FIG. 6 shows an exemplary test bench circuitry, according to an exemplary embodiment.

FIG. 6 shows an exemplary test bench 600 generated by one or more systems and methods described herein. As shown herein, a device under test (DUT) 601 is being tested by the test bench 600 providing one or more electrostatic discharge (ESD) stimulus signals to the DUIT, wherein the stimulus signals may be based upon a human body model (HBM) and/or a charged device model (CDM). The test bench 600 may comprise one or more power sources 602, one or more resistors 603, one or more capacitors 606, one or more inductors 604, and one or more switches 605. The test bench 600 therefore may comprise an RLC circuit providing ESD stimulation to the DUT 601. In some embodiments, the test bench 600 may comprise or interact with additional circuitry (not shown) simulating a package that the DUT is mounted upon.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A computer implemented method comprising:
receiving, by a computer, a netlist file comprising data records of a plurality of circuit devices and a plurality of nets interconnecting the plurality of circuit devices, wherein the netlist file forms a device under test (DUT);
calculating, by the computer, a first parameter associated with a first injection pin of the DUT based upon data records of at least a first portion of the plurality of circuit devices and the plurality of nets;
generating, by the computer, a first test bench comprising a resistance inductance capacitance (RLC) circuit for the first injection pin based on the first parameter;
transmitting, by the computer, an electrostatic discharge (ESD) stimulus from the RLC circuit to the first injection pin of the DUT;
in response to determining by the computer that the ESD stimulus discharged through a ground pin of the DUT:
generating, by the computer, an indication that the DUT has passed an ESD analysis test on the first injection pin; and
generating, by the computer, a second test bench comprising a second RLC circuit for the second injection pin based on a second parameter associated with a second injection pin of the DUT.

2. The method of claim 1, further comprising:
displaying, by the computer, the indication that the DUT has passed the ESD analysis test on the first injection pin on a graphical user interface.

3. The method of claim 1, wherein the first parameter comprises at least one of: an ON resistance of the first injection pin and characteristics of the substrate network of the DUT.

4. The method of claim 1, further comprising:
receiving, by the computer, a selection of the second injection pin and a second ground pin;
calculating, by the computer, the second parameter associated with the second injection pin of the DUT based upon data records of at least a second portion of the plurality of circuit devices and the plurality of nets;
transmitting, by the computer, a second ESD stimulus from the second RLC circuit to the second injection pin of the DUT; and
in response to determining by the computer that the second ESD stimulus discharged through the second ground pin of the DUT:
generating, by the computer, an indication that the DUT has passed an ESD analysis test on the second injection pin.

5. The method of claim 1, further comprising:
receiving, by the computer, a selection of the first injection pin and the ground pin.

6. The method of claim 1, wherein at least one test bench is based upon a human body model or charged device model.

7. The method of claim 1, wherein a package circuit is connected to the DUT.

8. The method of claim 1, further comprising:
receiving, by the computer, a selection of human body model or a charged device model through a graphical user interface; and
generating, by the computer, the at least one test bench based upon the received selection.

9. The method of claim 1, further comprising:
displaying, by the computer, a graphical user interface configured to allow a modification of the ESD stimulus.

10. A system for circuit design, comprising:
one or more computers comprising a non-transitory machine-readable media configured to store a netlist file comprising data records of a plurality of circuit devices and a plurality of nets interconnecting the plurality of circuit devices, wherein the netlist file forms a device under test (DUT);
at least one computer of the one or more computers, the at least one computer coupled to the non-transitory machine readable media storing the netlist file and comprising a processor configured to:
calculate a plurality of parameters associated respectively with a plurality of injection pins of the DUT based upon data records of at least a corresponding portion of the plurality of circuit devices and the plurality of nets;
generate a plurality of pin-specific test benches, including a first test bench comprising a first resistance inductance capacitance (RLC) circuit for a first injection pin based on a first parameter and a second test bench comprising a second RLC circuit for a second injection pin based on a second parameter;
transmit an electrostatic discharge (ESD) stimulus from the RLC circuit to the first injection pin of the DUT; and
in response to determining by the processor that the ESD stimulus discharged through a ground pin of the DUT:
generate an indication that the DUT has passed an ESD analysis test on the first injection pin.

11. The system of claim 10, wherein the processor is further configured to:
displaying, by the computer, the indication that the DUT has passed the ESD analysis test on the first injection pin on a graphical user interface.

12. The system of claim 10, wherein first parameter comprises at least one of: an ON resistance of the first injection pin and characteristics of the substrate network of the DUT.

13. The system of claim 10, wherein the processor is further configured to:
receive a selection of the second injection pin and a second ground pin;
calculate the second parameter associated with the second injection pin of the DUT based upon data records of at least a second corresponding portion of the plurality of circuit devices and the plurality of nets;
transmit a second ESD stimulus from the second RLC circuit to the second injection pin of the DUT; and
in response to determining by the processor that the second ESD stimulus discharged through the second ground pin of the DUT:
generate an indication that the DUT has passed an ESD analysis test on the injection second pin.

14. The system of claim 10, wherein the processor is further configured to:
receive a selection of the first injection pin and the ground pin.

15. The system of claim 10, wherein at one test bench is based upon a human body model or a charged device model.

16. The system of claim 10, wherein a package circuit is connected to the DUT.

17. The system of claim 10, wherein the processor is further configured to:

receive a selection of human body model or a charged device model through a graphical user interface; and generate at least one test bench based upon the received selection.

18. The system of claim 10, wherein the processor is further configured to:

display a graphical user interface configured to allow a modification of the ESD stimulus.

19. A computer readable non-transitory medium containing one or more computer instructions, which when executed by a processor cause the processor to:

receive a netlist file comprising data records of a plurality of circuit devices and a plurality of nets interconnecting the plurality of circuit devices, wherein the netlist file forms a device under test (DUT);

calculate a first parameter associated with a first injection pin of the DUT based upon data records of at least a portion of the plurality of circuit devices and the plurality of nets;

generate a first test bench comprising a resistance inductance capacitance (RLC) circuit for the first injection pin based on the first parameter;

transmit an electrostatic discharge (ESD) stimulus from the RLC circuit to the first injection pin of the DUT;

in response to determining by the processor that the ESD stimulus discharged through a ground pin of the DUT:

generate an indication that the DUT has passed an ESD analysis test on the first injection pin; and generate a second test bench comprising a second RLC circuit for the second injection pin based on a second parameter associated with a second injection pin of the DUT.

20. The computer readable non-transitory medium of claim 19, comprising further instructions to cause the processor to:

display the indication that the DUT has passed the ESD analysis test on the first injection pin on a graphical user interface.

* * * * *